United States Patent
Shin et al.

(10) Patent No.: US 10,199,115 B2
(45) Date of Patent: Feb. 5, 2019

(54) MANAGING REFRESH FOR FLASH MEMORY

(71) Applicant: QUALCOMM Incorporated, San Diego, CA (US)

(72) Inventors: Hyunsuk Shin, San Diego, CA (US); Robert Hardacker, Fallbrook, CA (US); Hung Vuong, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/615,827

(22) Filed: Jun. 6, 2017

(65) Prior Publication Data

US 2017/0365352 A1    Dec. 21, 2017

Related U.S. Application Data

(60) Provisional application No. 62/352,393, filed on Jun. 20, 2016.

(51) Int. Cl.
| | |
|---|---|
| *G11C 16/04* | (2006.01) |
| *G11C 16/34* | (2006.01) |
| *G06F 12/02* | (2006.01) |

(52) U.S. Cl.
CPC ...... *G11C 16/3431* (2013.01); *G06F 12/0246* (2013.01); *G11C 16/3418* (2013.01)

(58) Field of Classification Search
CPC .................................................. G11C 16/3431
See application file for complete search history.

(56) References Cited

U.S. PATENT DOCUMENTS

| | | |
|---|---|---|
| 2012/0033519 A1 | 2/2012 | Confalonieri et al. |
| 2014/0013036 A1 | 1/2014 | Kwon et al. |
| 2015/0154111 A1 | 6/2015 | D'Abreu et al. |
| 2017/0243644 A1* | 8/2017 | Bedeschi ........... G11C 16/3418 |

OTHER PUBLICATIONS

International Search Report and Written Opinion—PCT/US2017/036397—ISA/EPO—dated Sep. 25, 2017.

* cited by examiner

*Primary Examiner* — Uyen B Tran
(74) *Attorney, Agent, or Firm* — Muncy, Geissler, Olds & Lowe, P.C.

(57) ABSTRACT

Systems and method for a host-driven data refresh of a Flash memory include registers provided in the Flash memory for storing various settings related to refresh operations, such as, when to start/stop refreshing, target partitions in the memory, target start/end address ranges for refreshing, refresh algorithms, refresh rate requirements, etc. A host can control the various settings for start/stop refreshing, target partitions in the memory, target start/end address ranges for refreshing, refresh algorithms, through the corresponding registers; and the Flash memory can control various values related to refresh rate requirements through corresponding registers. In this manner, a standard platform or interface is provided within the Flash memory for refresh operations thereof.

44 Claims, 4 Drawing Sheets

MANAGING REFRESH FOR FLASH MEMORY

CROSS-REFERENCE TO RELATED APPLICATIONS

The present Application for Patent claims the benefit of U.S. Provisional Patent Application No. 62/352,393, entitled "MANAGING REFRESH FOR FLASH MEMORY," filed Jun. 20, 2016, and assigned to the assignee hereof, and expressly incorporated herein by reference in its entirety.

FIELD OF DISCLOSURE

Disclosed aspects are directed to Flash memory. More specifically, exemplary aspects are directed to refresh operations for improving data retention in Flash memory.

BACKGROUND

Flash memory is a non-volatile memory or storage medium which can be electrically programmed, erased, and reprogrammed. In Flash memory, information may be stored in an array of memory cells made from floating-gate transistors. The memory cells may be single-level cells (SLCs), wherein each memory cell stores only one bit of information or multi-level cells (MLCs) (e.g., triple-level cells (TLCs)), wherein each memory cell can store more than one bit of information. There are two main types of Flash memory: NAND type Flash memory and NOR type Flash memory, wherein the memory cells exhibit characteristics similar to the corresponding NAND and NOR logic gates, respectively. Flash memory is seen in various applications such as in memory cards, universal synchronous bus (USB) Flash drives, solid-state hard drives, etc.

Advantages of Flash memories include characteristics such as non-volatility, fast read access times, mechanical shock resistance, high durability, etc. However, Flash memories may also have some drawbacks. For example, although a Flash memory can be read or programmed one byte or one word at a time in a random access fashion, a Flash memory may only be erased one block (comprising multiple words) at a time. Another drawback relates to the finite number of program/erase cycles that may be supported by a Flash memory before the Flash memory wears down and integrity of storage thereof deteriorates. Yet another drawback pertains to a characteristic referred to as "read disturb," wherein a read operation on certain memory cells of a NAND Flash memory, for example, can cause the information stored in neighboring memory cells within the same memory block to change over time, or become incorrectly programmed A similar problem may also arise with a program disturb, wherein programming some memory cells may lead to unintended disturbances of other memory cells. Furthermore, the storage of information in memory cells of a Flash memory is based on floating-gates of the memory cells being charged. However, over time, issues of charge loss from the memory cells due to the floating gates may also lead to loss of storage integrity of the memory cells.

The various above-mentioned drawbacks may lead to errors or bit-flips in the data stored in a Flash memory comprising a NAND Flash memory, for example. The rate at which bit-flips may occur can increase as the Flash memory ages with more program/erase cycles. The bit-flip error rate may also increase with advancing generations of memory technology as device sizes shrink, because interference can increase with technology scaling (shrinking).

Although bit-flip errors are soft errors which may be corrected or restored by refreshing (e.g., rewriting or scrubbing) the data stored in the Flash memory, there is no standard mechanism in the industry for refreshing data stored in Flash storage devices. In general, data refresh operations in Flash storage devices may be performed in a vendor-specific manner which may vary across various manufacturers. For example, when a consuming or processing device reads data from a page of a NAND Flash memory, if error control coding (ECC) is performed on that page, then one manner of data refresh may be based on determining if a number of bits with errors to be corrected is greater than a pre-specified threshold. If the number of such bit errors is greater than the pre-specified threshold, then the processing device (or a memory controller in the processing device) may direct a refresh operation to be performed on that page of the NAND Flash memory. However, this method of directing refresh operations is not standard across the various consuming devices, and as such, different consuming devices may employ different manners of directing refresh operations on the same NAND Flash memory.

In some cases, refresh operation of Flash memory may be driven by the Flash memory itself, which may initiate an internal refresh without external indications or triggers from the consuming device or host device (e.g., a processor connected to the Flash memory). However, a manufacturer or vendor of the Flash memory may not have substantial information on the retention requirements of the host device or target application which uses the Flash memory. Thus, the refresh operation internally controlled by the Flash memory may lack information regarding the target application, so the refresh operations may be carried out without knowledge of when to start or stop refreshing in order to avoid performance impacts on the target application.

Accordingly, there is a need in the art for techniques for performing refresh operations on Flash memory, which avoid the aforementioned drawbacks.

SUMMARY

Exemplary aspects of the invention are directed to systems and method for a host-driven data refresh of a Flash memory. In exemplary aspects, standard registers are provided in the Flash memory for storing various settings related to refresh operations, such as, when to start/stop refreshing, target partitions in the Flash memory, target start/end address ranges for refreshing, refresh algorithms, refresh rate requirements, etc. A host device can control the various settings for start/stop refreshing, target partitions in the memory, target start/end address ranges for refreshing, refresh algorithms, through the corresponding registers; and the Flash memory can control various values related to refresh rate requirements through corresponding registers. In this manner, a standard platform or interface is provided within the Flash memory for refresh operations on the Flash memory.

For example, an exemplary aspect is directed to a method of performing refresh operations on a Flash memory. The method comprises setting one or more refresh registers of the Flash memory with values received from a host, and performing refresh operations on the Flash memory based on the values set in the one or more refresh registers.

Another exemplary aspect is directed to an apparatus comprising a Flash memory, wherein the Flash memory comprises one or more refresh registers configured to be programmed with values received from a host. The Flash memory is configured to perform refresh operations based on the values programmed in the one or more refresh registers.

Yet another exemplary aspect is directed to a non-transitory computer-readable storage medium comprising code, which, when executed by a processor, causes the processor to perform refresh operations on a Flash memory. The non-transitory computer-readable storage medium comprises code for setting one or more refresh registers of the Flash memory with values received from a host, and code for performing refresh operations on the Flash memory based on the values set in the one or more refresh registers.

Yet another exemplary aspect is directed to an apparatus comprising a Flash memory, wherein the Flash memory comprises means for storing settings received from a host, the settings associated with refresh operations to be performed on the Flash memory. The Flash memory also comprises means for performing refresh operations on the Flash memory based on the settings.

BRIEF DESCRIPTION OF THE DRAWINGS

The accompanying drawings are presented to aid in the description of aspects of the invention and are provided solely for illustration of the aspects and not limitation thereof.

DETAILED DESCRIPTION

Figure 1:
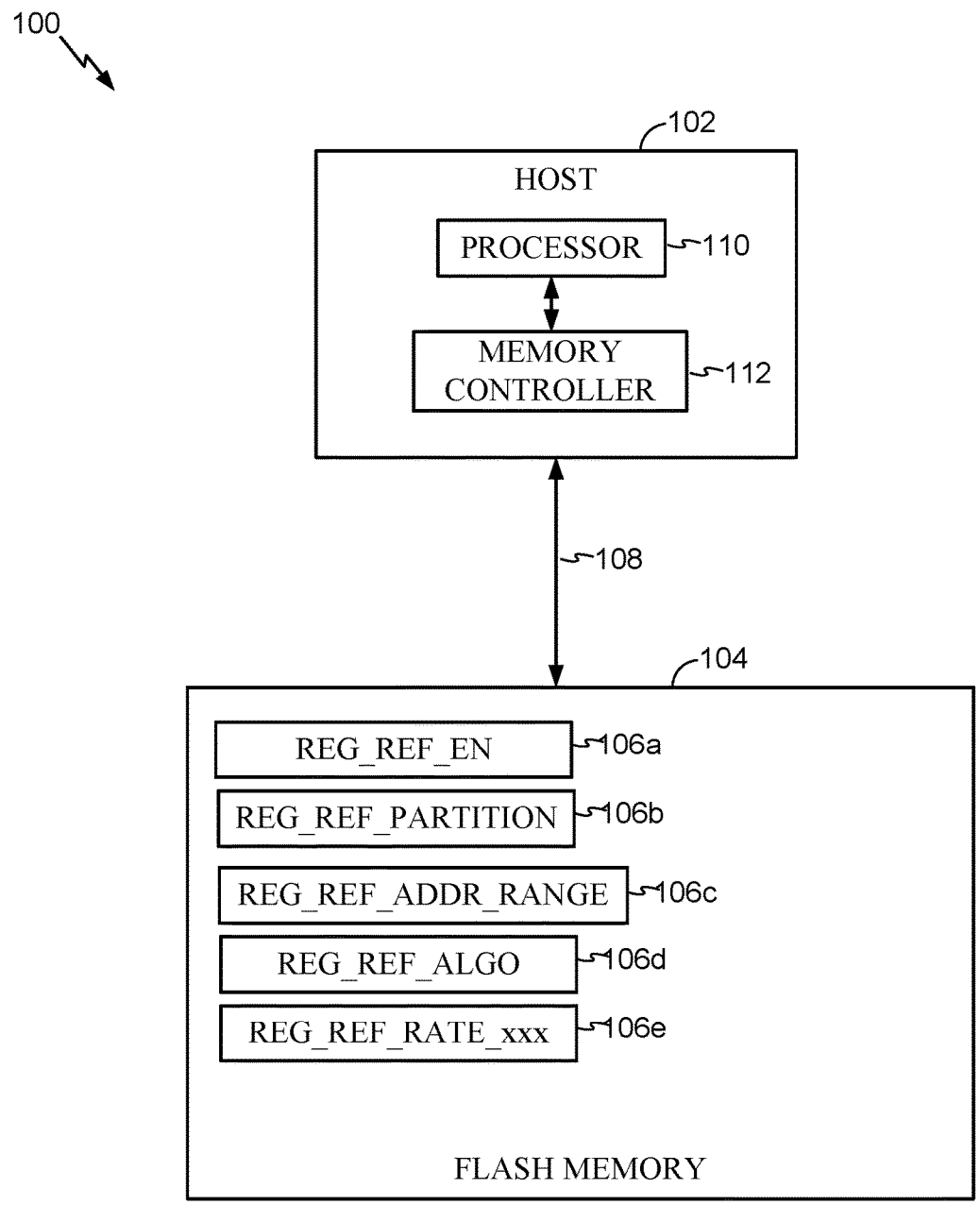
FIG. 1 illustrates a system comprising a host and a Flash memory according to this disclosure.

Aspects of the invention are disclosed in the following description and related drawings directed to specific aspects of the invention. Alternate aspects may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any aspect described herein as "exemplary" is not necessarily to be construed as preferred or advantageous over other aspects. Likewise, the term "aspects of the invention" does not require that all aspects of the invention include the discussed feature, advantage or mode of operation.

The terminology used herein is for the purpose of describing particular aspects only and is not intended to be limiting of aspects of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer-readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Exemplary aspects of this disclosure are directed to data refresh of a Flash memory which may be driven by a host in some instances. Standard registers (or equivalently, any other means for storing) are provided in the Flash memory for storing various settings related to refresh operations, such as, when to start/stop refreshing, target partitions in the memory, target start/end address ranges for refreshing, refresh algorithms, refresh rate requirements, etc. In an aspect, the host can control the various settings for start/stop refreshing, target partitions in the memory, target start/end address ranges for refreshing, refresh algorithms, through the corresponding registers; and the Flash memory can control various values related to refresh rate requirements through corresponding registers. In this manner, a standard platform or interface is provided within the Flash memory for refresh operations thereof. The host device may control, program, and reprogram, the various parameters as needed for a target application on the host device, by means of the corresponding registers.

With reference to FIG. 1, an exemplary apparatus is shown, designated as processing system 100 and representatively comprising host 102 and Flash memory 104. Host 102 may include any processing device or consuming device which interfaces with Flash memory 104 through an appropriate interface 108 to read and/or write data in Flash memory 104. Without loss of generality, Flash memory 104 may be of any type (e.g., NAND Flash memory, NOR Flash memory, etc.), although NAND Flash memory may be particularly discussed in some examples herein.

In an exemplary aspect, host 102 may include processor 110 (which may be any special or general purpose processor) configured to interface with memory controller 112 to make read/write requests and receive/send corresponding data to memory elements including Flash memory 104. Memory controller 112 may control read/write operations of memory elements connected to host 102, including Flash memory 104. In exemplary aspects, host 102 and more specifically, memory controller 112 may control data refresh of Flash memory 104 by programming exemplary registers which may be provided in Flash memory 104. Flash memory 104 may be configured to perform refresh operations based on the settings in or programmed values in the aforementioned registers. In this regard, Flash memory 104 may include any known processing element, refresh controller, or other logic (although not explicitly shown or described but recognizable by one skilled in the art based on this disclosure) for performing refresh operations on data stored in Flash memory 104 based on the settings programmed in the registers.

In an exemplary aspect, Flash memory 104 is shown to include registers 106a-e, which may be programmed by host 102 for example. Registers 106a-e may be configured to provide a standard programming interface and so may be referred to as standard registers in some aspects. It will be understood that although some examples and features of registers 106a-e will be provided in this disclosure, it will be understood that various other registers or combinations thereof may be configured in accordance with this disclosure for controlling refresh operations on Flash memory 104 without departing from the scope of exemplary aspects provided herein. Aspects of registers 106a-e will now be discussed in further detail below.

A first register (REG_REF_EN) 106a may be used to start and/or stop refresh operations of Flash memory 104. To start a refresh operation, host 102 (or more specifically, memory controller 112) may set REG_REF_EN 106a (e.g., to "1") to start the refresh operation. In this regard, host 102 (or more specifically, memory controller 112) may also program other registers such as a second register REG_REF_PARTITION 106b, a third register REG_REF_ADDR_RANGE 106c, and a fourth register REG_REF_ALGO 106d before starting a refresh operation, which will be discussed in more detail below.

The second register, REG_REF_PARTITION 106b may be configured to designate at least one partition of one or more partitions of memory in Flash memory 104 to be refreshed. In some aspects, REG_REF_PARTITION 106b may support special fields or reserved values such as 0xFF which may be used to refresh all partitions of memory in Flash memory 104.

The third register, REG_REF_ADDR_RANGE 106c may be configured to specify an address range, e.g., in a partition specified by REG_REF_PARTITION 106b, to be refreshed. The address ranges may be specified using start and end addresses. In some aspects, an entire or whole partition range can be specified for refreshing by using special programming notations or values for REG_REF_AD-DR_RANGE 106c such as start address=end address=0x0.

The fourth register REG_REF_ALGO 106d, as will be discussed further can be used to specify a particular refresh algorithm among one or more possible refresh algorithms to be used for a refresh operation.

Once refresh operation has started based on the above settings of the first to fourth registers 106a-d, Flash memory 104 may run refresh operations in the background in some cases, while allowing host 102 access to partitions or address ranges not being refreshed. However it is noted that allowing regular read/write operations and/or task management operations, for example, to be performed normally in this manner while a refresh operation is on-going in the background mode, may impact performance or speed of access for the regular read/write operations in some cases. Accordingly, decisions may be made regarding performance tradeoffs and refresh needs in individual cases.

In some aspects, REG_REF_EN 106a may be cleared (e.g., by being set to "0"), by Flash memory 104 when the refresh operation has been completed. Host 102 can check the status of REG_REF_EN 106a to see if refresh operation is on-going (e.g., REG_REF_EN 106a is set to "1") or if refresh operation has been completed (e.g., REG_REF_EN 106a is set to "0").

In some aspects, host 102 may also stop an on-going refresh operation by clearing REG_REF_EN 106a (e.g., setting it to "0"). For example, when full performance is desired (i.e., performance impact due to background refresh operation is undesirable or unacceptable), host 102 may interrupt the on-going refresh operation by setting REG_RE-F_EN 106a to "0." If host 102 interrupts an on-going refresh operation in this manner, then host 102 may re-start the refresh operation for the target address range at a later point in time by setting REG_REF_EN 106a to "1."

Referring now to REG_REF_ALGO 106d in more detail, this fourth register may be set by host 102 to select a specific refresh algorithm among one or more possible refresh algorithms. If an algorithm is not selected in this manner, refresh operation may be unselective in the refresh algorithm used, in the sense that each memory cell holding data in the target address range may be refreshed (e.g., in brute-force manner). An unselective refresh algorithm may be the most robust option to ensure data retention in some aspects. However, such an unselective refresh may also take a long time to complete and thus have endurance and performance impacts which may be weighed against the advantages of unselective refresh in choosing an appropriate refresh algorithm in some aspects.

On the other hand, by choosing an algorithm to perform selective refresh operations, memory cells, e.g., which store specific data which meets vendor specific criteria, for example, may be selectively refreshed. The vendor criteria may vary depending on error rate, NAND Flash type, etc., related to Flash memory 104 and the selective refresh operation may be faster and improve endurance of Flash memory 104.

With reference now to the fifth register REG_REF_RA-TE_xxx 106e, refresh rate requirements of Flash memory 104 may be provided by configuring this register. A desired or required refresh rate for Flash memory 104 may be determined depending on the memory type, temperature, algorithm (set by host 102, for example), etc. One or more processing elements, sensors, control functions, or combinations thereof may be utilized by Flash memory 104 to set the values of REG_REF_RATE_xxx 106e in the following manner. The data in Flash memory 104 may be refreshed with a rate according to one or more values of REG_RE-F_RATE_xxx 106e, to ensure data retention characteristics required for Flash memory 104 are met. In this regard, Flash memory 104 may set REG_REF_RATE_xxx 106e with a rate, which may be expressed as the number of days, in one example implementation. The refresh rate may change over time and so the value of REG_REF_RATE_xxx 106e can be changed accordingly. For example, for a new Flash memory 104, at the beginning of its life cycle, the refresh rate can be set to a very low amount (i.e., refreshed less frequently) since Flash memory 104 may display a high retention characteristic (or viewed differently, low error characteristics) when Flash memory 104 is new and has not undergone a large number of program/erase cycles. As Flash memory 104 gets older the refresh rate may be increased to ensure data retention.

In some cases, Flash memory 104 can seek an increase in the refresh rate. For example, if Flash memory 104 detects unexpected weak memory cells in one or more partitions during operation, Flash memory 104 may be able to set a higher refresh rate for those one or more partitions.

The register REG_REF_RATE_xxx 106e may be set to different, multiple values for different types of memory. For example, embedded multi-media cards (eMMC) and Universal Flash Storage (UFS) can have different memory types (e.g., SLC, MLC, TLC, etc.) for different partitions. Accordingly, Flash memory 104 can set different refresh rates for different memory types (e.g., the refresh rate REG_RE-F_RATE_SLC for a SLC can be 100 days, and REG_RE-F_RATE_MLC for an MLC can be 10 days).

Further, REG_REF_RATE_xxx 106e may be set to multiple different values for different refresh algorithms. For example, a selective algorithm can require more frequent refresh as it selectively refreshes data (e.g., refresh rate REG_REF_RATE_SEL for a selective refresh can be 60 days, while REG_REF_RATE_UNSEL for an unselective refresh can be 90 days).

The register REG_REF_RATE_xxx 106e may also be set to multiple different values for different temperature conditions. For example, Flash memory 104 can set a refresh rate to cause more frequent refreshes in higher temperature (e.g., refresh rate REG_REF_RATE_95 C at 95 C can be 10 days, while REG_REF_RATE_−40 C at −40 C can be 100 days).

In some aspects, REG_REF_RATE_xxx 106e may be set to combinations of values, which can dynamically change over time. For example, for a combination of values based on memory type, refresh algorithm, and temperature, for REG_REF_RATE_xxx 106e may yield 18 different settings for refresh rates (e.g., (SLC/MLC/TLC)×(SEL/UNSEL)× (95 C/25 C/−40 C)).

Figure 2A:
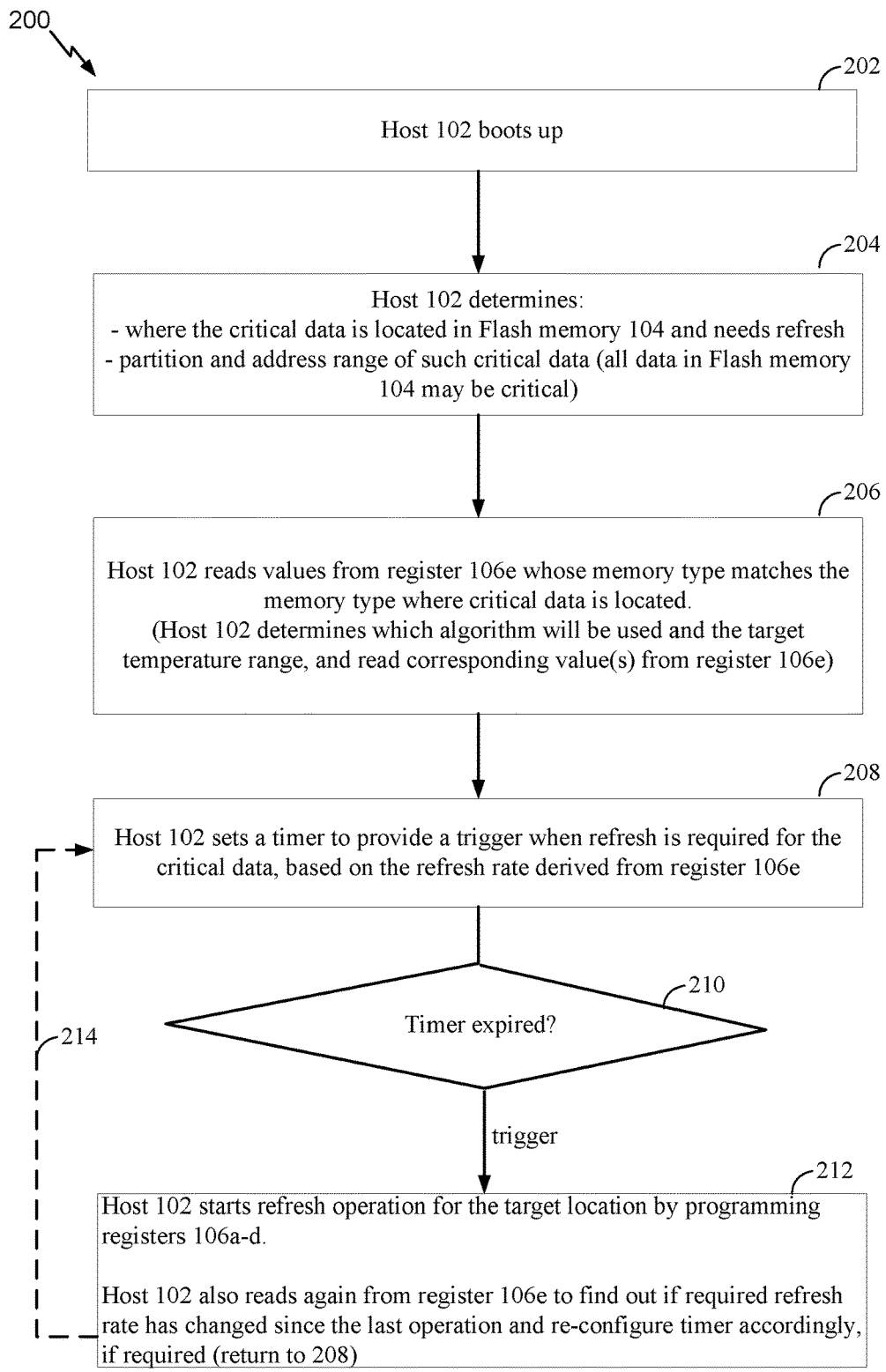
FIGS. 2A-B illustrate flow charts pertaining to methods of managing refresh operations on a Flash memory according to exemplary aspects of this disclosure.

Accordingly, it will be appreciated that aspects include various methods for performing the processes, functions and/or algorithms disclosed herein. For example, as illustrated in FIG. 2A, an aspect can include a method 200 of performing refresh operations on a Flash memory, e.g., Flash memory 104.

Method 200 can start at Block 202, wherein host 102 boots up in one example.

In Block 204, host 102 (or more specifically, memory controller 112) may determine where critical data, for example, which needs to be refreshed, is located in Flash memory 104. Host 102 may also determine the partition and address range of such critical data in Flash memory 104, keeping in mind that in some cases, all data in Flash memory 104 may be critical data.

In Block 206, host 102 may read values from register REG_REF_RATE_xxx 106e whose memory type matches the memory type where critical data is located. In this regard, host 102 can determine which algorithm will be used for refreshing, the target temperature range, etc., and read corresponding value(s) for refresh rates from register REG_REF_RATE_xxx 106e.

In Block 208, host 102 may set a timer to provide an alert or trigger when refresh is required for the critical data, based on the refresh rate derived from register REG_REF_RATE_xxx 106e in Block 206.

In Block 210, once the timer set in Block 208 expires, or a corresponding time period lapses, a trigger is generated.

In Block 212, based on the trigger, host 102 may start refresh operations for the target location in Flash memory 104 by programming one or more registers 106a-d. Host 102 may also read register REG_REF_RATE_xxx 106e one or more additional times to check if the refresh rate in REG_REF_RATE_xxx 106e has changed, since Flash memory 104 may change the values of REG_REF_RATE_xxx 106e over time for various reasons outlined above. If the refresh rate in REG_REF_RATE_xxx 106e has changed, then host 102 may re-configure the timer accordingly (e.g., returning to Block 208 via path 214 shown in dashed lines as this path may be optional). Host 102 can repeat the above processes in Block 212 over the course of time as any of the one or more above criteria and related registers 106a-e change over time.

Figure 2B:
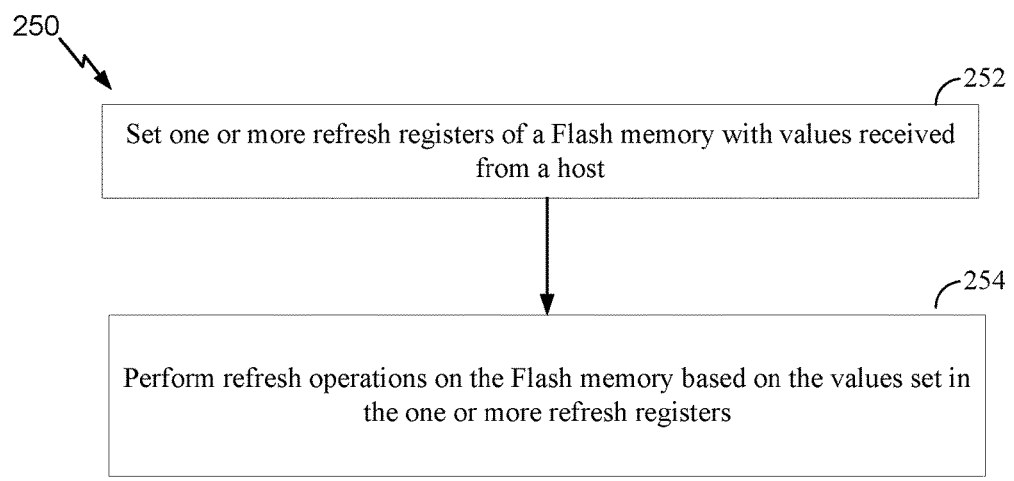

With reference now to FIG. 2B, another exemplary process flow related to a method of performing refresh operations on a Flash memory (e.g., Flash memory 104) is illustrated and designated as method 250.

Block 252 of method 250 comprises, setting one or more refresh registers of the Flash memory with values received from a host (e.g., host 102). Block 252 can comprise setting one or more of the first to fifth registers 106a-e according to the following examples.

One example includes setting a first register (e.g., REF_REG_EN 106a) to indicate start/stop settings for refresh operations, wherein in some aspects, Flash memory 104 may be configured to stop an ongoing refresh operation when the first register is cleared.

Another example includes setting a second register (e.g., REF_REG_PARTITION 106b) to indicate at least one partition of one or more target memory partitions of Flash memory 104 for refresh operations, wherein in one aspect, Flash memory 104 may be configured to refresh all of the target memory partitions when the second register is set with a special field.

Another example includes setting a third register (e.g., REF_REG_ADDR_RANGE 106c) to indicate an address range to be refreshed. In an aspect, the third register may be set with a start address and an end address for the address range, wherein Flash memory 104 may be configured to refresh an entire or whole address partition range when the start address and end address are set to a same value.

Another example includes setting a fourth register (e.g., REF_REG_ALGO 106d) to indicate a refresh algorithm for performing the refresh operations. In one aspect, Flash memory 104 may be configured to refresh all data cells in a target address range for the refresh operations when the refresh algorithm is set to an unselective state or selectively refresh a desired portion of a target address range for the refresh operations when the refresh algorithm is set to selectively refresh the desired portion of the target address range.

Yet another example includes setting a fifth register (e.g., REF_REG_RATE_xxx 106e) to indicate refresh rates for performing the refresh operations. In some aspects, Flash memory 104 may be configured to set the values of the fifth register based on desired or required refresh rates. For example, Flash memory 104 may set different values in the fifth register to indicate different refresh rates for different memory types in the Flash memory; set different values in the fifth register to indicate different refresh rates for different refresh algorithms; and/or set different values in the fifth register to indicate different refresh rates for different temperature conditions of the Flash memory.

With continued reference to FIG. 2B, Block 254 comprises performing refresh operations on the Flash memory based on the values set in the one or more refresh registers. For example, Flash memory 104 may be configured to perform refresh operations based on the values of one or more of the first to fifth registers 106a-e as described above. In this regard, Flash memory 104 may comprise any means for performing the refresh operations (e.g., have a processing element, refresh controller, etc., not explicitly shown, but will be recognized by one skilled in the art based on this disclosure) based on the values of one or more of the first to fifth registers 106a-e as described above.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an aspect of the invention can include computer-readable media embodying a method for accessing a DRAM array and performing low power self-correction by integrating a self-correction operation within a self-refresh cycle. Accordingly, the invention is not limited to illustrated examples and any means for performing the functionality described herein are included in aspects of the invention.

Figure 3:
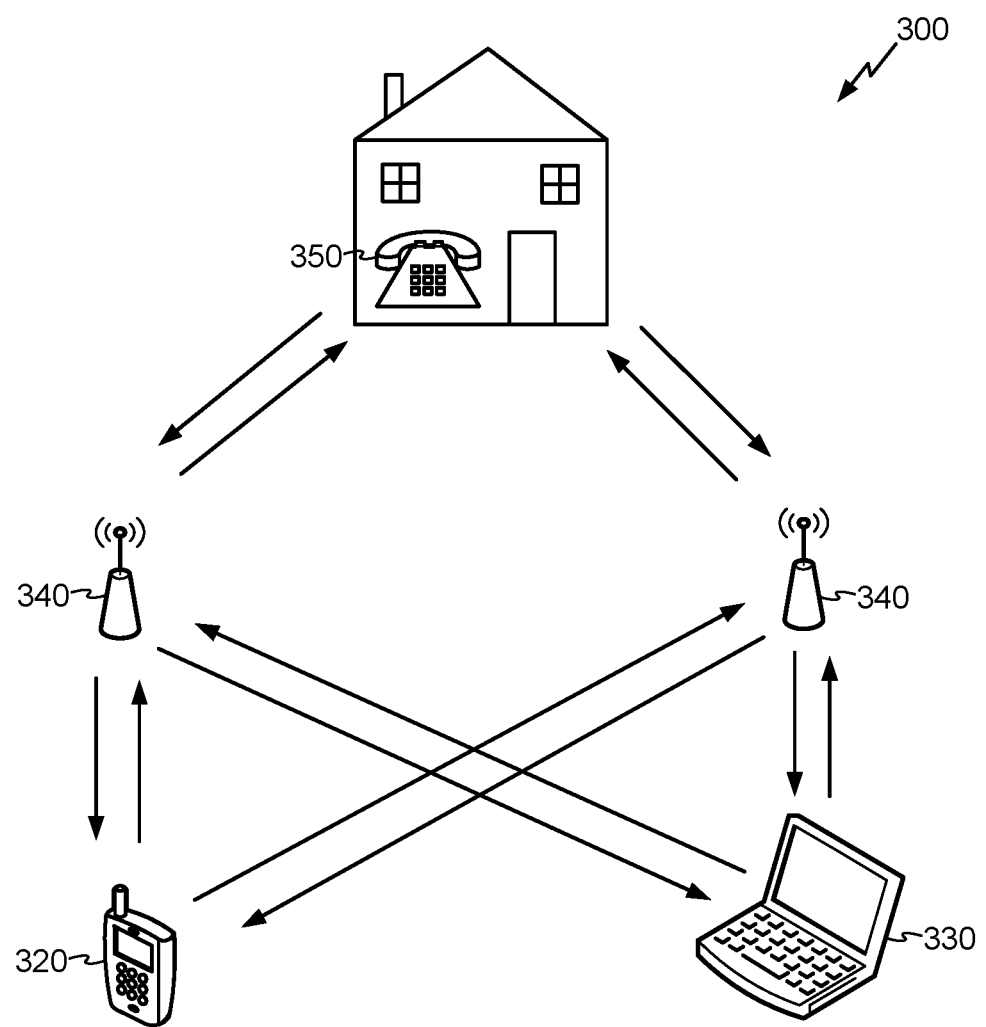
FIG. 3 is a block diagram showing an exemplary wireless communication system in which aspects of the disclosure may be advantageously employed.

FIG. 3 illustrates an exemplary wireless communication system 300 in which an aspect of the disclosure may be advantageously employed. For purposes of illustration, FIG. 3 shows three remote units 320, 330, and 350 and two base stations 340. In FIG. 3, remote unit 320 is shown as a mobile telephone, remote unit 330 is shown as a portable computer, and remote unit 350 is shown as a fixed location remote unit in a wireless local loop system. For example, the remote units may be mobile phones, hand-held personal communication systems (PCS) units, portable data units such as personal data assistants, global positioning system (GPS) enabled devices, navigation devices, set-top boxes, music players, video players, entertainment units, fixed location data units such as meter reading equipment, or any other device that stores or retrieves data or computer instructions, or any combination thereof. Although FIG. 3 illustrates remote units according to the teachings of the disclosure, the disclosure is not limited to these exemplary illustrated units. Aspects of the disclosure may be suitably employed in any device which includes active integrated circuitry including memory and on-chip circuitry for test and characterization.

The foregoing disclosed devices and methods are typically designed and are configured into GDSII and GERBER computer files, stored on computer-readable media. These files are in turn provided to fabrication handlers who fabricate devices based on these files. The resulting products are semiconductor wafers that are then cut into semiconductor die and packaged into a semiconductor chip. The chips are then employed in devices described above.

While the foregoing disclosure shows illustrative aspects of the invention, it should be noted that various changes and modifications could be made herein without departing from the scope of the invention as defined by the appended claims. The functions, steps and/or actions of the method claims in accordance with the aspects of the invention described herein need not be performed in any particular order. Furthermore, although elements of the invention may be described or claimed in the singular, the plural is contemplated unless limitation to the singular is explicitly stated.

What is claimed is:

1. A method of performing refresh operations on a Flash memory, the method comprising:
    setting one or more refresh registers of the Flash memory with values received from a host; and
    performing refresh operations on the Flash memory based on the values set in the one or more refresh registers, wherein setting the one or more refresh registers comprises at least one of:
        setting a first register to indicate start/stop settings for the refresh operations and clearing the first register to stop an ongoing refresh operation;
        setting a second register to indicate at least one partition of one or more target memory partitions of the Flash memory for the refresh operations;
        setting a fourth register to indicate a refresh algorithm for performing the refresh operations; or
        setting a fifth register to indicate refresh rates for performing the refresh operations.

2. The method of claim 1, further comprising setting the second register with a special field to refresh all of the one or more target memory partitions.

3. The method of claim 1, further comprising setting the refresh algorithm to an unselective state to refresh all data cells in a target address range for the refresh operations.

4. The method of claim 1, further comprising setting the refresh algorithm to selectively refresh a desired portion of a target address range for the refresh operations.

5. The method of claim 1, further comprising setting different values in the fifth register to indicate different refresh rates for different memory types in the Flash memory.

6. The method of claim 1, further comprising setting different values in the fifth register to indicate different refresh rates for different refresh algorithms.

7. The method of claim 1, further comprising setting different values in the fifth register to indicate different refresh rates for different temperature conditions of the Flash memory.

8. The method of claim 1, wherein setting the one or more refresh registers comprises:
    setting the first register to indicate the start/stop settings;
    setting the second register to indicate the at least one partition;
    setting the fourth register to indicate the refresh algorithm for performing the refresh operations; and
    setting the fifth register to indicate the refresh rates.

9. The method of claim 1, wherein setting the one or more refresh registers comprises:
    setting the first register to indicate the start/stop settings; and
    setting the second register to indicate the at least one partition.

10. The method of claim 1, wherein setting the one or more refresh registers comprises:
    setting the first register to indicate the start/stop settings; and
    setting the fourth register to indicate the refresh algorithm for performing the refresh operations.

11. The method of claim 1, wherein setting the one or more refresh registers comprises:

setting the first register to indicate the start/stop settings; and setting the fifth register to indicate the refresh rates.

12. The method of claim 1, wherein setting the one or more refresh registers comprises:
setting the second register to indicate the at least one partition; and
setting the fourth register to indicate the refresh algorithm for performing the refresh operations.

13. The method of claim 1, wherein setting the one or more refresh registers comprises:
setting the second register to indicate the at least one partition; and
setting the fifth register to indicate the refresh rates.

14. The method of claim 1, wherein setting the one or more refresh registers comprises:
setting the fourth register to indicate the refresh algorithm for performing the refresh operations; and
setting the fifth register to indicate the refresh rates.

15. The method of claim 1, wherein setting the one or more refresh registers comprises:
setting the first register to indicate the start/stop settings;
setting the second register to indicate the at least one partition; and
setting the fourth register to indicate the refresh algorithm for performing the refresh operations.

16. The method of claim 1, wherein setting the one or more refresh registers comprises:
setting the first register to indicate the start/stop settings;
setting the second register to indicate the at least one partition; and
setting the fifth register to indicate the refresh rates.

17. The method of claim 1, wherein setting the one or more refresh registers comprises:
setting the first register to indicate the start/stop settings;
setting the fourth register to indicate the refresh algorithm for performing the refresh operations; and
setting the fifth register to indicate the refresh rates.

18. The method of claim 1, wherein setting the one or more refresh registers comprises:
setting the second register to indicate the at least one partition;
setting the fourth register to indicate the refresh algorithm for performing the refresh operations; and
setting the fifth register to indicate the refresh rates.

19. The method of claim 1, wherein setting the one or more refresh registers comprises:
setting the first register to indicate the start/stop settings.

20. The method of claim 1, wherein setting the one or more refresh registers comprises:
setting the second register to indicate the at least one partition.

21. The method of claim 1, wherein setting the one or more refresh registers comprises:
setting the fourth register to indicate the refresh algorithm for performing the refresh operations.

22. The method of claim 1, wherein setting the one or more refresh registers comprises:
setting the fifth register to indicate the refresh rates.

23. An apparatus including a Flash memory, the Flash memory comprising:
one or more refresh registers configured to be programmed with values received from a host; and
wherein the Flash memory is configured to perform refresh operations based on the values programmed in the one or more refresh registers,
wherein the one or more refresh registers comprises one or more of:
a first register configured to be programmed to indicate start/stop settings for the refresh operations, wherein the Flash memory is configured to stop an ongoing refresh operation when the first register is cleared;
a second register configured to be programmed to indicate at least one partition of one or more target memory partitions of the Flash memory for the refresh operations;
a fourth register configured to be programmed to indicate a refresh algorithm for the refresh operations to be performed on the Flash memory; or
a fifth register configured to be programmed to indicate refresh rates for performing the refresh operations.

24. The apparatus of claim 23, wherein the Flash memory is configured to refresh all of the one or more target memory partitions when the second register is set to a special field.

25. The apparatus of claim 23, wherein the Flash memory is configured to refresh all data cells in a target address range when the refresh algorithm is set to an unselective state.

26. The apparatus of claim 23, wherein the Flash memory is configured to selectively refresh a desired portion of a target address range when the refresh algorithm is set to selectively refresh the desired portion of the target address range.

27. The apparatus of claim 23 integrated into a device selected from the group consisting of mobile phones, handheld personal communication systems (PCS) units, portable data units, global positioning system (GPS) enabled devices, navigation devices, set-top boxes, music players, video players, entertainment units, and fixed location data units.

28. The apparatus of claim 23, wherein the one or more refresh registers comprises:
the first register;
the second register;
the fourth register; and
the fifth register.

29. The apparatus of claim 23, wherein the one or more refresh registers comprises:
the first register; and
the second register.

30. The apparatus of claim 23, wherein the one or more refresh registers comprises:
the first register; and
the fourth register.

31. The apparatus of claim 23, wherein the one or more refresh registers comprises:
the first register; and
the fifth register.

32. The apparatus of claim 23, wherein the one or more refresh registers comprises:
the second register; and
the fourth register.

33. The apparatus of claim 23, wherein the one or more refresh registers comprises:
the second register; and
the fifth register.

34. The apparatus of claim 23, wherein the one or more refresh registers comprises:
the fourth register; and
the fifth register.

35. The apparatus of claim 23, wherein the one or more refresh registers comprises:
the first register;
the second register; and
the fourth register.

36. The apparatus of claim 23, wherein the one or more refresh registers comprises:
the first register;
the second register; and
the fifth register.

37. The apparatus of claim 23, wherein the one or more refresh registers comprises:
the first register;
the fourth register; and
the fifth register.

38. The apparatus of claim 23, wherein the one or more refresh registers comprises:
the second register;
the fourth register; and
the fifth register.

39. The apparatus of claim 23, wherein the one or more refresh registers comprises:
the first register.

40. The apparatus of claim 23, wherein the one or more refresh registers comprises:
the second register.

41. The apparatus of claim 23, wherein the one or more refresh registers comprises:
the fourth register.

42. The apparatus of claim 23, wherein the one or more refresh registers comprises:
the fifth register.

43. A non-transitory computer-readable storage medium comprising code, which, when executed by a processor, causes the processor to perform refresh operations on a Flash memory, the non-transitory computer-readable storage medium comprising:
code for setting one or more refresh registers of the Flash memory with values received from a host; and
code for performing refresh operations on the Flash memory based on the values set in the one or more refresh registers,
wherein the one or more refresh registers comprises one or more of:
a first register programmable to indicate start/stop settings for the refresh operations, wherein the Flash memory is configured to stop an ongoing refresh operation when the first register is cleared;
a second register programmable to indicate at least one partition of one or more target memory partitions of the Flash memory for the refresh operations;
a fourth register programmable to indicate a refresh algorithm for the refresh operations to be performed on the Flash memory; or
a fifth register programmable to indicate refresh rates for performing the refresh operations.

44. An apparatus including a Flash memory, the Flash memory comprising:
means for storing settings received from a host, the settings associated with refresh operations to be performed on the Flash memory; and
means for performing refresh operations on the Flash memory based on the settings, wherein the means for storing settings comprises one or more of:
a first means for storing start/stop settings for the refresh operations, wherein the Flash memory is configured to stop an ongoing refresh operation when the first register is cleared;
a second means for storing settings to indicate at least one partition of one or more target memory partitions of the Flash memory for the refresh operations;
a fourth means for storing settings to indicate a refresh algorithm for the refresh operations to be performed on the Flash memory; or
a fifth means for storing settings to indicate refresh rates for performing the refresh operations.

* * * * *